United States Patent
Zhong et al.

(10) Patent No.: US 8,772,051 B1
(45) Date of Patent: Jul. 8, 2014

(54) FABRICATION METHOD FOR EMBEDDED MAGNETIC MEMORY

(71) Applicant: Headway Technologies, Inc., Milpitas, CA (US)

(72) Inventors: Tom Zhong, Saratoga, CA (US); Kenlin Huang, Fremont, CA (US); Chyu-Jiuh Torng, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/766,990

(22) Filed: Feb. 14, 2013

(51) Int. Cl.
*H01L 21/00* (2006.01)

(52) U.S. Cl.
USPC .......................................................... 438/3

(58) Field of Classification Search
None
See application file for complete search history.

(56) References Cited

U.S. PATENT DOCUMENTS

| 2010/0221848 A1 | 9/2010 | Keshtbod et al. |
| 2012/0043630 A1 | 2/2012 | Omori et al. |
| 2012/0087180 A1 | 4/2012 | Mani |

*Primary Examiner* — Scott B Geyer
(74) *Attorney, Agent, or Firm* — Saile Ackerman LLC; Stephen B. Ackerman (57) ABSTRACT

A wafer has a memory area and a logic area and a topmost metal contact layer on the surface covered with dielectric and etch stop layers. In the memory area, vias are opened through the dielectric and etch stop layers to topmost metal contact layer. In the logic area, evenly distributed dummy fill patterns are opened through a portion of the dielectric and etch stop layers. These are filled with a metal layer and planarized, forming a flat wafer surface. MTJ elements in the memory area and dummy elements in the logic area are formed on the flat surface. The dummy MTJ elements and fill patterns are etched away in the logic area. Metal connections are formed to the topmost metal contact layer in the logic area and top lead connections to MTJ elements are formed in the memory area.

17 Claims, 7 Drawing Sheets

FABRICATION METHOD FOR EMBEDDED MAGNETIC MEMORY

TECHNICAL FIELD

This disclosure is related to Magnetic Devices, and more particularly, to methods of integrating Magnetic Devices with semiconductor devices.

BACKGROUND

Spin torque memory is now believed scalable down beyond the 65 nm technology node. One attractive area of application is embedded magnetic random access memory (MRAM) to replace embedded flash memory or embedded dynamic random access memory (DRAM) for its unique features of writing/reading speed, writing endurance, and low power consumption. In order to make embedded MRAM production-worthy, one must not only overcome the technique challenges of making the magnetic junction array to meet the embedded memory product design requirements including read/write speed, read/write current limits, reading margin, long-term thermal stability, etc., but also integrate the memory array seamlessly with the peripheral logic circuit which normally occupies the majority of the space.

From our MRAM process development experiences, in order to achieve the optimum performance of the magnetic memory, it must be built on perfectly flat surfaces. Since MRAM junction arrays are normally built on the BEOL (back-end-of line), uniform dummy fill over the entire wafer and a CMP process are required to fabricate such flat surfaces. However, since the embedded memory only allows a small portion of the chip area for the magnetic memory arrays, the dummy fills over the logic areas will prevent the integration between the magnetic array and the logic circuit.

MRAM devices are often combined with complementary metal-oxide-semiconductor (CMOS) devices. Process integration involves connection between MRAM and CMOS elements without causing any defect related issues.

U.S. Patent Application 2010/00221848 (Keshtbod et al), 2012/0087180 (Mani), and 2012/0043630 (Omori et al) disclose various methods of forming CMOS and MRAM devices together.

SUMMARY

It is the primary objective of the present disclosure to provide a new integration method to incorporate a memory array into a logic circuit seamlessly without design constraints to the embedded memory chip design.

Another objective of the present disclosure is to provide a new integration method to remove dummy fill over the logic area during the memory process so that the memory array can be incorporated into the logic circuit seamlessly without design constraints to the embedded memory chip design.

In accordance with the objectives of the present disclosure, a method of fabricating an embedded memory in a logic device is achieved. A wafer is provided having a memory area and a logic area. A topmost metal contact layer is provided on a surface of the wafer and covering with a first etch stop layer. An isolation dielectric layer is deposited on the first etch stop layer, a second etch stop layer is deposited on the isolation dielectric layer, and a second dielectric layer is deposited on the second etch stop layer. Thereafter, in the memory area, vias are opened through the dielectric and etch stop layers to the topmost metal contact layer and, in the logic area, evenly distributed dummy fill patterns are opened through the second dielectric layer and the second etch stop layer. The vias and dummy fill patterns are filled with a metal layer and planarized, thereby forming a flat wafer surface. MTJ elements are formed on the flat wafer surface in the memory area and dummy MTJ elements are formed on the flat wafer surface in the logic area. Thereafter, the memory area is covered with a mask and all the dummy MTJ elements, dummy fill patterns, and surrounding layers in the logic area are etched away. Thereafter, the mask is removed and a top dielectric layer is deposited over the entire wafer and planarized. Metal connections are formed to the topmost metal contact layer in the logic area and top lead connections are formed to the MTJ elements in the memory area.

Also in accordance with the objectives of the present disclosure, another method of fabricating an embedded memory in a logic device is achieved. A wafer is provided having a memory area and a logic area. A topmost metal contact layer is provided on a surface of the wafer and covered with a first etch stop layer. An isolation dielectric layer is deposited on the first etch stop layer. Thereafter, in the memory area, vias are opened through the isolation dielectric layer and the first etch stop layer to the topmost metal contact layer and filled with copper. A second etch stop layer is deposited on the isolation dielectric layer and the copper vias. A second dielectric layer is deposited on the second etch stop layer. Thereafter, in the memory area, openings are etched through the second dielectric layer and the second etch stop layer to the copper vias and, in the logic area, evenly distributed dummy fill patterns are opened through the dielectric and etch stop layers. The openings and dummy fill patterns are filled with a metal layer and planarized, thereby forming a flat wafer surface. MTJ elements are formed on the flat wafer surface in the memory area and dummy MTJ elements are formed on the flat wafer surface in the logic area. Thereafter, a third etch stop layer and an overlying hard mask layer are deposited over the MTJ elements. The memory area is covered with a mask and the hard mask layer is etched away to the third etch stop layer in the logic area. Thereafter, the mask is removed and the dummy MTJ elements, dummy fill patterns, and surrounding layers are etched away in the logic area. Thereafter, a top dielectric layer is deposited over the entire wafer and planarized. Metal connections are formed to the topmost metal contact layer in the logic area and top lead connections are formed to the MTJ elements in the memory area.

BRIEF DESCRIPTION OF THE DRAWINGS

In the accompanying drawings forming a material part of this description, there is shown.

DETAILED DESCRIPTION

Figure 1:
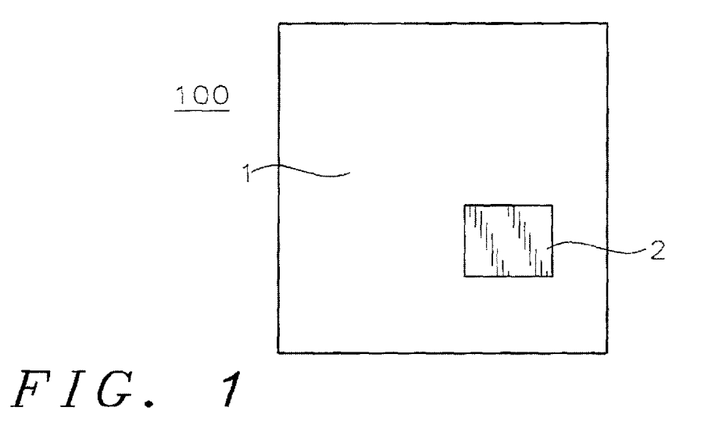
FIG. 1 is a top view of an embedded MRAM in a logic device.

The present disclosure is a process integration method of fabricating embedded memory devices. One or more mask layers are used to remove all dummy fill metal patterns that are used for chemical mechanical planarization (CMP) purposes over the logic circuit areas during magnetic junction array fabrication. After removal of the dummy fill metal patterns by dry etch or other methods, the wafers are planarized by a spin-on dielectric method or by a dielectric refill and CMP method FIG. 1 illustrates a top view of an embedded MRAM chip sample. The chip 100 is divided into two areas, logic area 1 and MRAM memory array area 2. It will be understood that the embedded memory could be a DRAM memory array or other memory array area.

Two alternative methods are disclosed, respectively, in a first embodiment illustrated in FIGS. 2-11 and a second embodiment illustrated in FIGS. 12-21.

Figure 2:
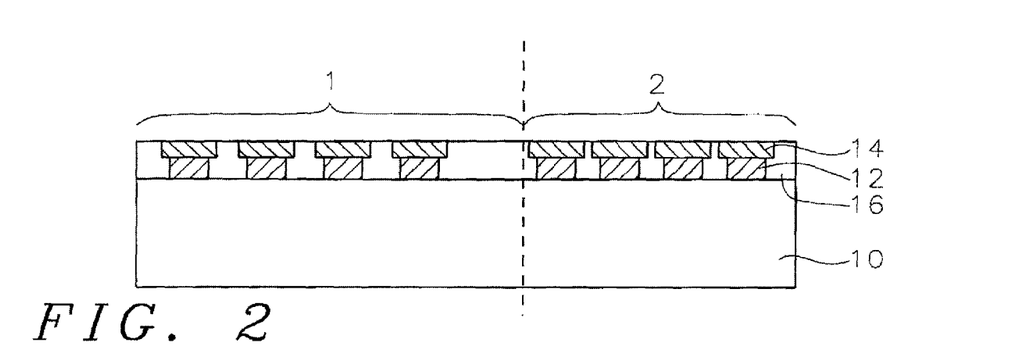
FIGS. 2-11 are cross-sectional representations of steps in a first preferred embodiment of the present disclosure.

Referring now more particularly to FIGS. 2-11, a first preferred method of the present disclosure will be described in detail. FIG. 2 illustrates a substrate 10. CMOS devices (not shown) are formed within the substrate. Connection vias 12 and topmost metal layer 14 of a CMOS device structure are shown, surrounded by dielectric layer 16. The metal layer 12 may be copper, for example. The metal layer 14 will connect to the memory array. For example, the metal layer 14 will serve as a metal landing pad for a magnetic tunnel junction (MTJ).

Figure 3:
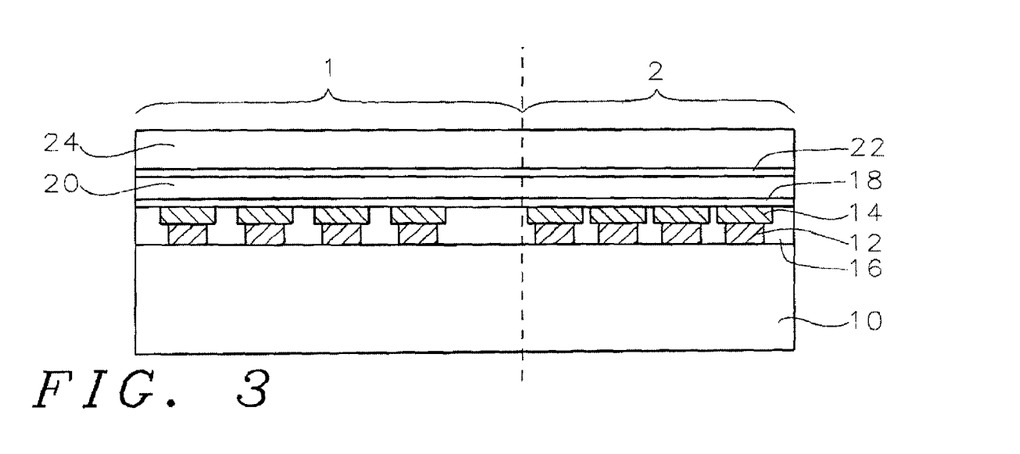

Now, referring to FIG. 3, a first etch stop layer 18, isolation dielectric layer 20, second etch stop layer 22, and second dielectric layer 24 are deposited in sequence over the entire wafer.

Figure 4:
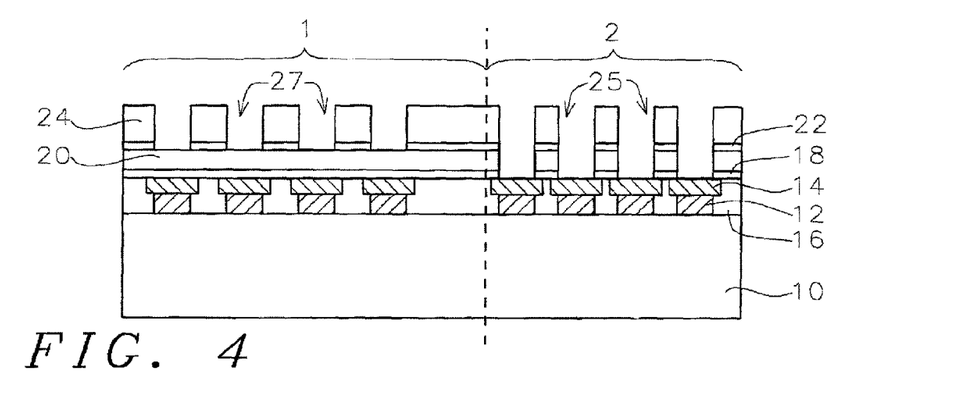

Next, two patterning and etching steps are performed. In the memory area 2, vias 25 are opened through the dielectric and etch stop layers 24, 22, 20, and 18 to the CMOS connection layer 14. Etching stops after etching through the first etch stop layer 18. In the logic area 1, evenly distributed dummy fill patterns 27 are etched through the dielectric layer 24 and second etch stop layer 22. Etching stops after etching through the second etch stop layer 22. The logic area 1 is fully populated with the evenly distributed dummy fill patterns. Vias 25 and dummy fill patterns 27 are shown in FIG. 4.

Figure 5:
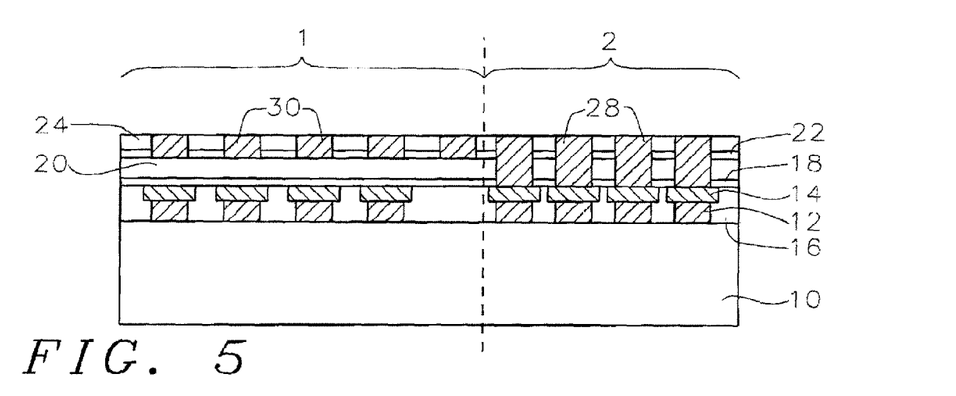

Next, a single metal CMP process is performed to create a flat connection via layer 28 and 30. The vias 25 and dummy fill patterns 27 are filled with a metal layer. The metal layer may be tantalum, tungsten, titanium, titanium nitride, tantalum nitride, or alloys of these materials. The metal layer is planarized using a CMP process, resulting in metal filling the vias 28 and dummy fill pattern 30, as shown in FIG. 5. This creates a flat layer over the entire wafer.

Figure 6:
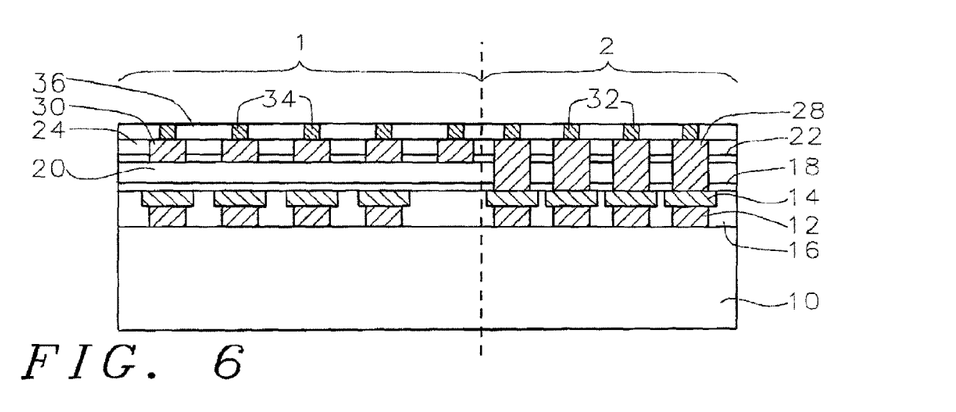

Now, the magnetic tunnel junctions (MTJ) are formed on the flat wafer surface. The logic area 1 is also fully populated with evenly distributed dummy MTJ patterns for CMP planarization purposes. FIG. 6 illustrates the MTJ elements 32 and dummy MTJ elements 34. Dielectric material 36 is deposited over the MTJ elements and dummy MTJ elements and planarized. The material can be silicon oxide, silicon nitride, or bi-layers of silicon oxide and silicon nitride, alumina oxide, or any other types of dielectric material. The layer is planarized, for example, by CMP or by CMP planarization plus etch back or by spin-on dielectric material planarization plus etch back.

Figure 7:
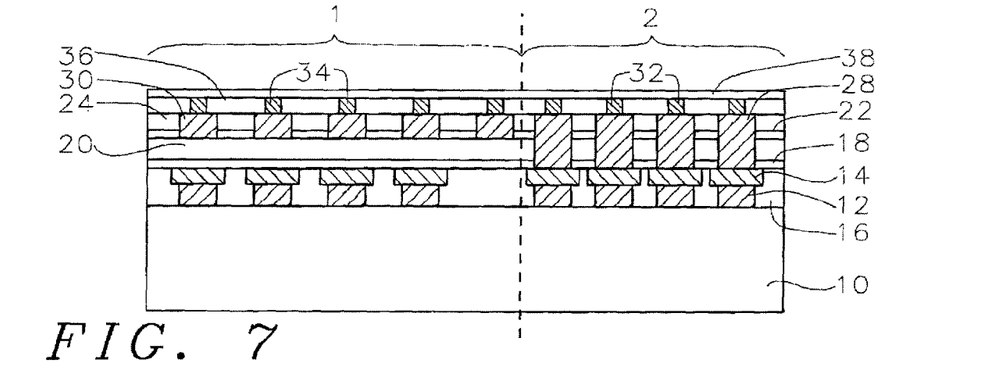

A dielectric layer 38 such as silicon nitride or a metal such as tantalum or tantalum nitride is deposited over the planarized MTJ elements, as shown in FIG. 7.

Figure 8:
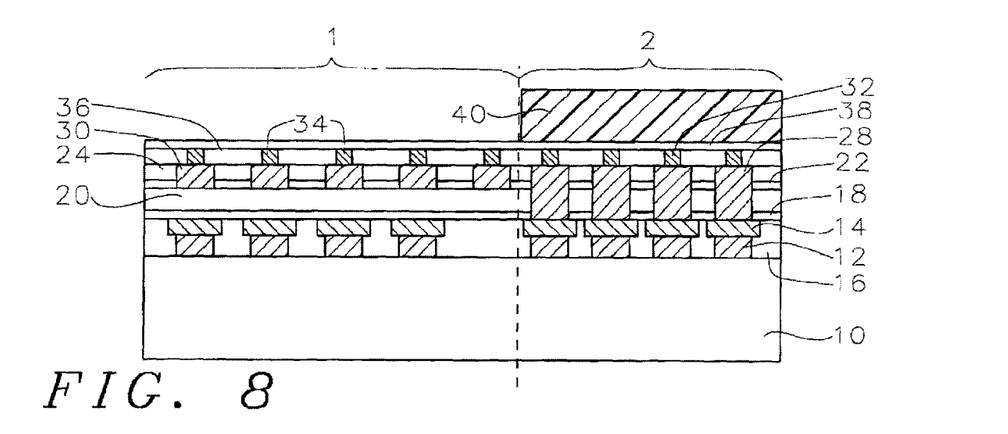
Figure 9:
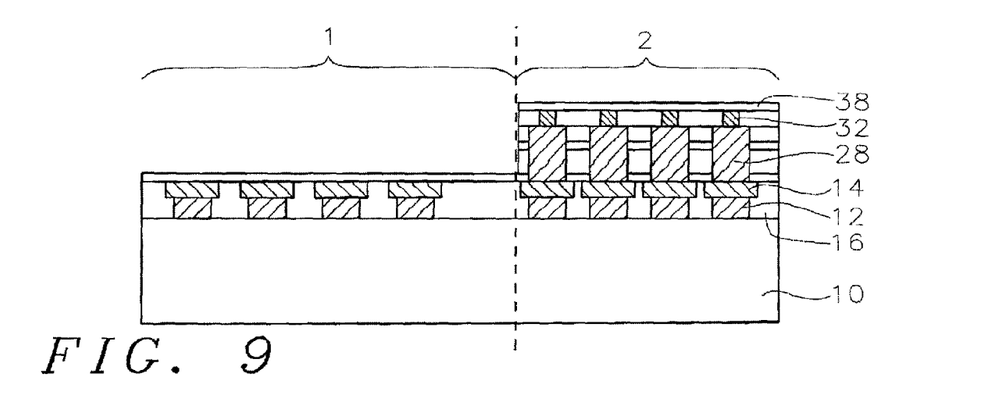

Now, the memory area 2 is covered by a mask 40, such as a photoresist mask, as shown in FIG. 8. All of the logic area 1 is not covered by the mask. An etching is performed to remove all the dummy MTJ elements 34, dummy fill patterns 30, and surrounding layers. Everything is etched away in the logic area down to the first etch stop layer 18, as shown in FIG. 9.

Figure 10:
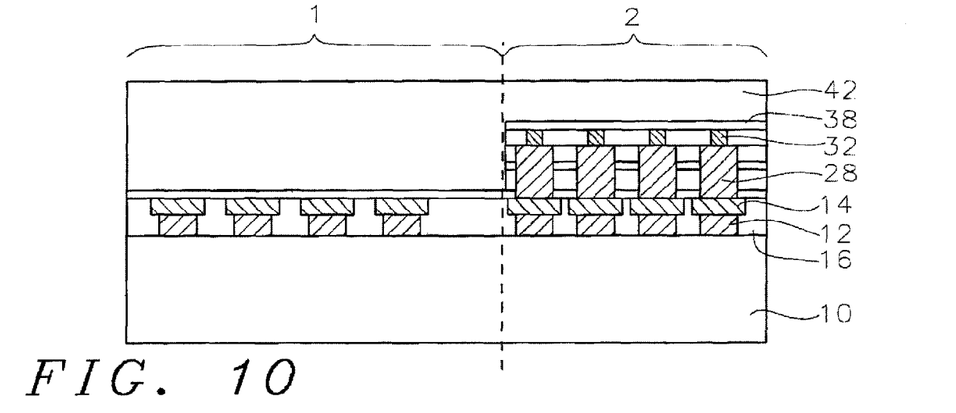

Next, the mask 40 is removed and a dielectric layer 42 is formed over the entire wafer. For example, this layer may be formed and planarized by a spin-on dielectric process or it may be deposited and then planarized by CMP, as illustrated in FIG. 10.

Figure 11:
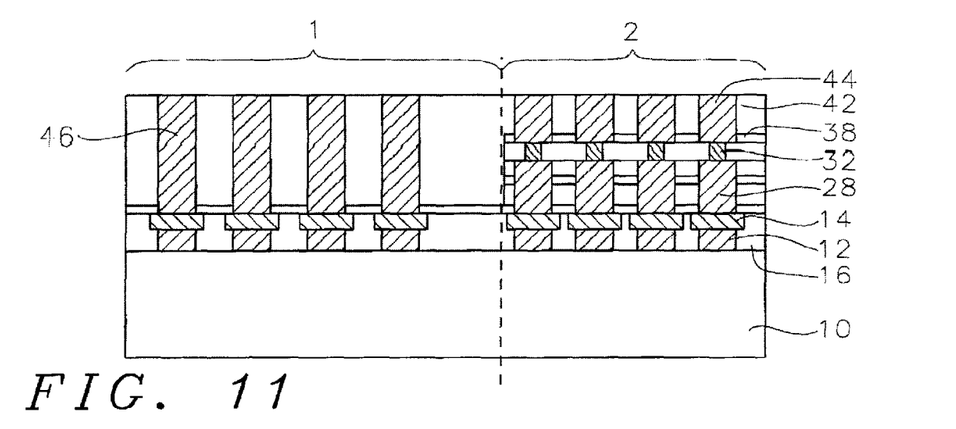

Finally, as shown in FIG. 11, metal connections for the logic area 1 and MRAM top lead connections in memory area 2 are fabricated. Via openings are etched through the dielectric layer 42 and the etch stop layer 18 in the logic area 1 and through dielectric layer 42 and etch stop layer 38 in the memory area 2. Metal is deposited into the via openings and etched back as is conventional in the art to form top leads 44 and logic connections 46. This completes fabrication of an embedded memory in a logic circuit.

Referring now more particularly to FIGS. 12-21, a second preferred method of the present disclosure will be described in detail. This method begins with the process as shown in FIG. 2.

Figure 12:
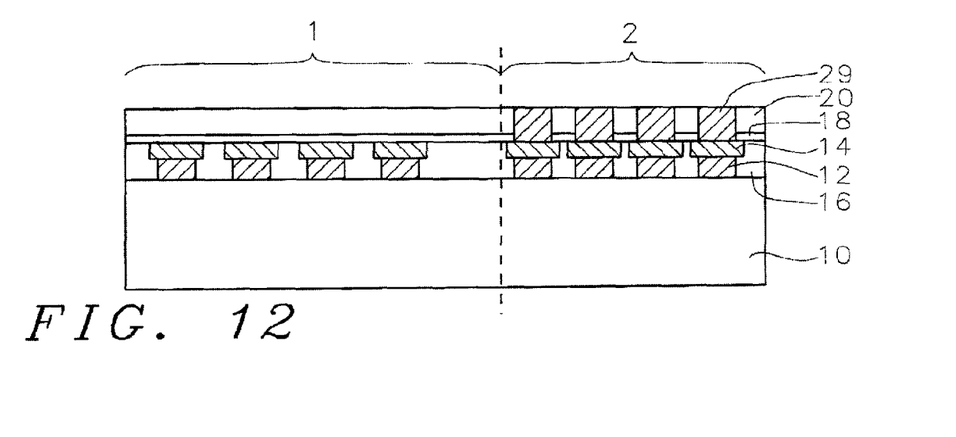
FIGS. 12-21 are cross-sectional representations of steps in a second preferred embodiment of the present disclosure.
Figure 13:
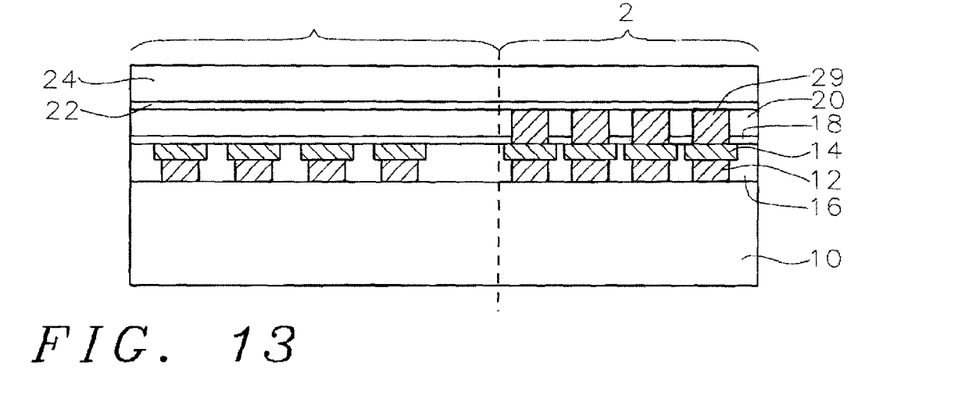

Continuing now with FIG. 12, a first capping and etch stop layer 18 and isolation dielectric layer 20 are deposited in sequence over the entire wafer.

Now, a single copper damascene process is performed to create connection vias 29 in the memory area 2. Next, in FIG. 13, second etch stop layer 22 and second dielectric layer 24 are deposited over the wafer.

Figure 14:
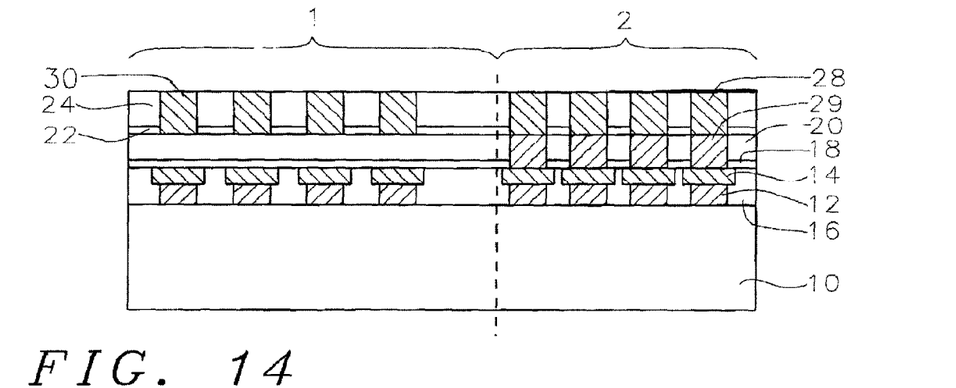

As illustrated in FIG. 14, openings are etched through the dielectric and etch stop layers 24 and 22 to the connection vias 29 in the memory area 2. In the logic area 1, evenly distributed dummy fill patterns are etched through the dielectric layer 24 and second etch stop layer 22. The logic area 1 is fully populated with the evenly distributed dummy fill patterns. The openings are filled with a metal layer 28, forming a metal interface for connection between the copper via and MTJ junctions. In the logic area 1, metal 30 forms a dummy interface layer pattern for CMP purposes. The metal layer may be tantalum, tungsten, titanium, titanium nitride, tantalum nitride, or alloys of these materials. The metal layer is planarized using a CMP process. This creates a flat layer over the entire wafer.

Figure 15:
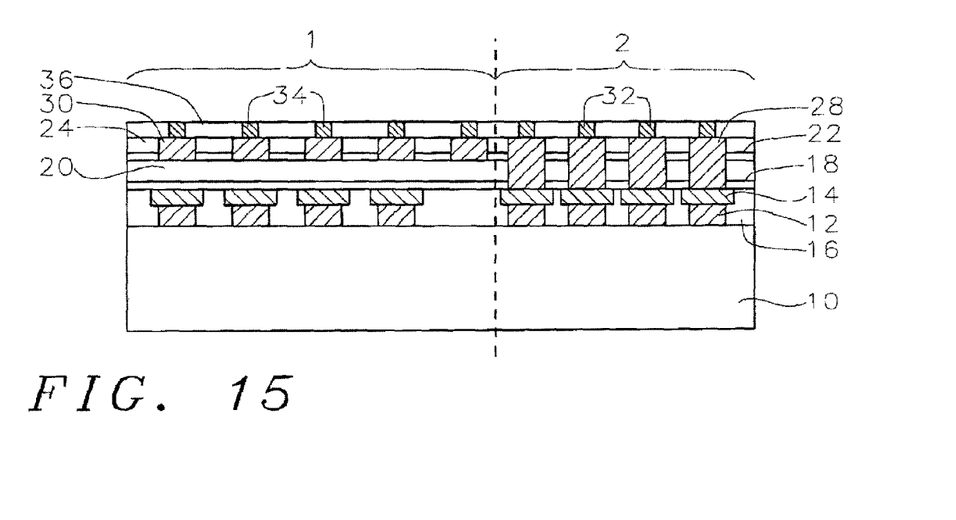

Now, the magnetic tunnel junctions (MTJ) are formed on the flat wafer surface. The logic area 1 is also fully populated with evenly distributed dummy MTJ patterns for CMP planarization purposes. FIG. 15 illustrates the MTJ elements 32 and dummy MTJ elements 34.

Figure 16:
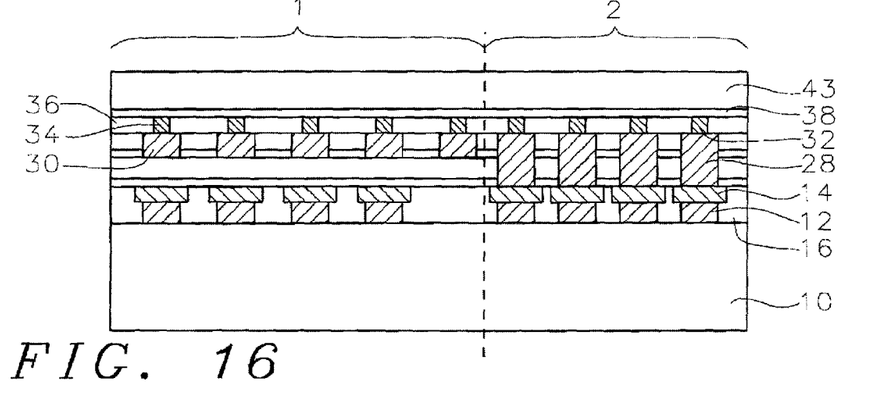

An etch stop layer 38 such as silicon nitride or a metal such as tantalum or tantalum nitride is deposited over the planarized MTJ elements, as shown in FIG. 16. Hard mask dielectric layer 43 is deposited over the etch stop layer 38.

Figure 17:
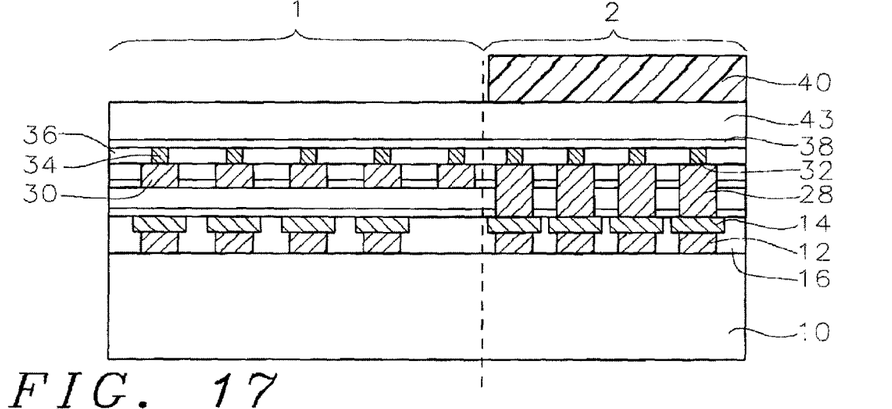
Figure 18:
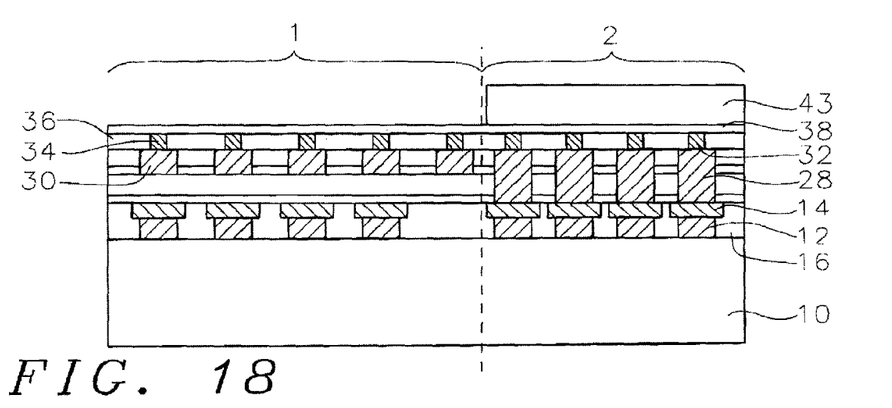

Now, the memory area 2 is covered by a mask 40, such as a photoresist mask, as shown in FIG. 17. All of the logic area 1 is not covered by the mask. The hard mask layer 43 is etched away in the logic area down to the etch stop layer 38, as shown in FIG. 18, and the mask 40 is removed.

Figure 19:
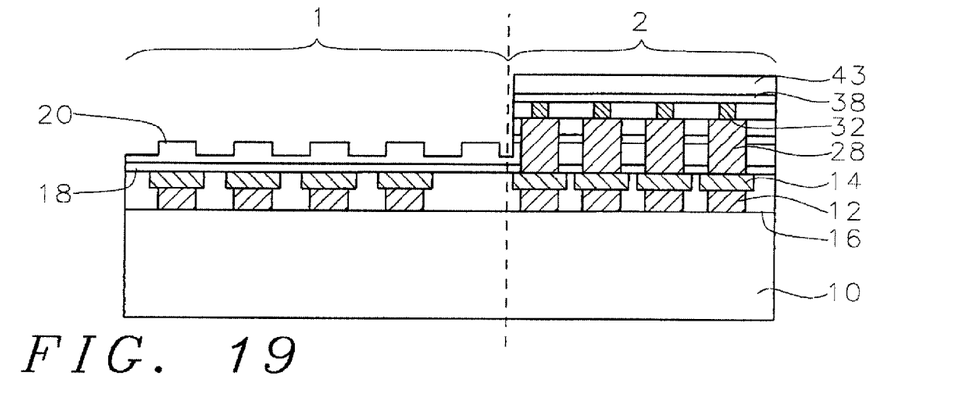

Etching is continued, using the dielectric layer 43 as a hard mask, to remove the dummy MTJ elements 34, dummy fill patterns 30, and surrounding layers in the logic area 1, as shown in FIG. 19.

Figure 20:
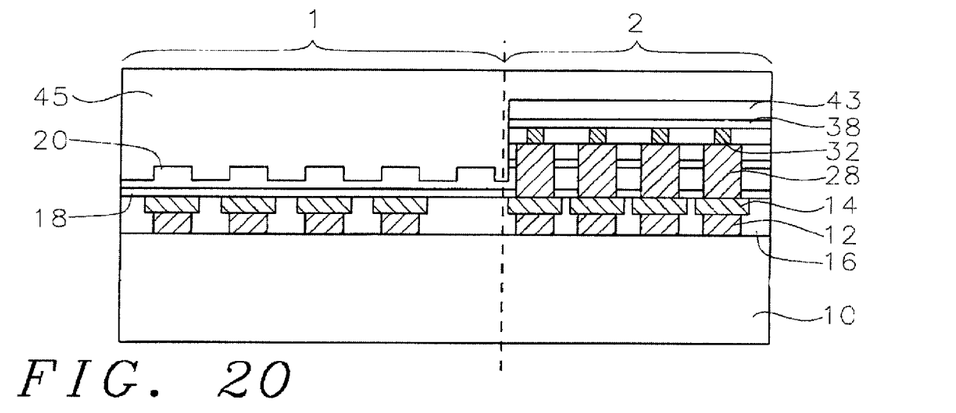

A dielectric layer 45 is formed over the entire wafer. For example, this layer may be formed and planarized by a spin-on dielectric process or it may be deposited and then planarized by CMP, as illustrated in FIG. 20.

Figure 21:
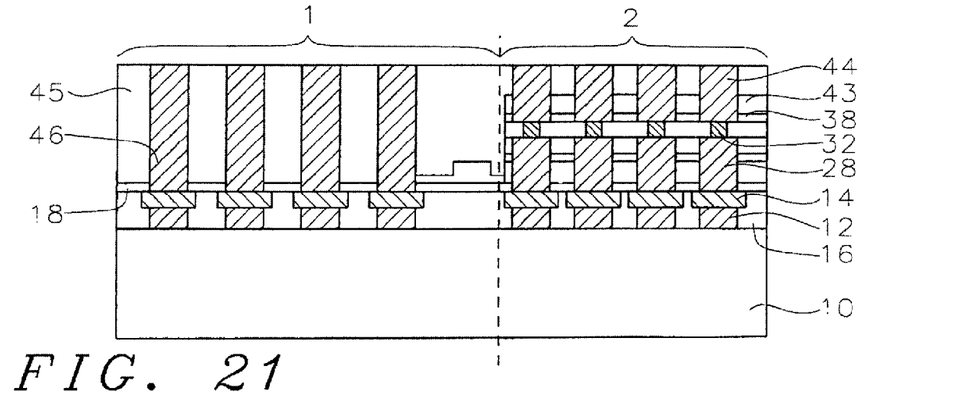

Finally, as shown in FIG. 21, metal connections for the logic area 1 and MRAM top lead connections in memory area 2 are fabricated. Via openings are etched through the dielectric layers 45 and 20 and the etch stop layer 18 in the logic area 1 and through dielectric layer 45 and etch stop layer 38 in the memory area 2. Metal is deposited into the via openings and etched back as is conventional in the art to form top leads 44 and logic connections 46. This completes fabrication of an embedded memory in a logic circuit.

The present disclosure provides a new process integration for embedded magnetic memory products. The method allows for seamless integration of a memory array into an embedded memory logic circuit without introducing any additional constraints to the memory array process or logic circuit design.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating an embedded memory device comprising:
   providing a wafer having a memory area and a logic area;
   providing a topmost metal contact layer on a surface of said wafer and covering said topmost metal contact layer with dielectric and etch stop layers;
   in said memory area, opening vias through said dielectric and etch stop layers to said topmost metal contact layer and, in said logic area, opening evenly distributed dummy fill patterns through a portion of said dielectric and etch stop layers;
   filling said vias and dummy fill patterns with a metal layer and planarizing said metal layer thereby forming a flat wafer surface;
   forming MTJ elements on said flat wafer surface in said memory area and forming dummy MTJ elements on said flat wafer surface in said logic area;
   thereafter etching away all said dummy MTJ elements, said dummy fill patterns, and surrounding layers in said logic area; and
   thereafter forming metal connections to said topmost metal contact layer in said logic area and forming top lead connections to said MTJ elements in said memory area.

2. The method according to claim 1 wherein said memory area is surrounded by said logic area.

3. The method according to claim 1 wherein said a topmost metal contact layer contacts a plurality of CMOS devices in a substrate of said wafer in a logic area and wherein said topmost metal contact layer in said memory area serves as a metal landing pad.

4. The method according to claim 1 wherein said topmost metal contact layer comprises copper.

5. The method according to claim 1 wherein said metal layer comprises tantalum, tungsten, titanium, titanium nitride, tantalum nitride, or alloys of these materials.

6. The method according to claim 1 wherein said metal connections and top lead connections comprise copper.

7. A method of fabricating an embedded memory device comprising:
   providing a wafer having a memory area and a logic area;
   providing a topmost metal contact layer on a surface of said wafer and covering said topmost metal contact layer with a first etch stop layer;
   depositing an isolation dielectric layer on said first etch stop layer;
   depositing a second etch stop layer on said isolation dielectric layer;
   depositing a second dielectric layer on said second etch stop layer;
   thereafter, in said memory area, opening vias through said dielectric and etch stop layers to said topmost metal contact layer and, in said logic area, opening evenly distributed dummy fill patterns through said second dielectric layer and said second etch stop layer;
   filling said vias and dummy fill patterns with a metal layer and planarizing said metal layer thereby forming a flat wafer surface;
   forming MTJ elements on said flat wafer surface in said memory area and forming dummy MTJ elements on said flat wafer surface in said logic area;
   thereafter covering said the memory area with a mask and etching away all said dummy MTJ elements, said dummy fill patterns, and surrounding layers in said logic area;
   thereafter removing said mask and depositing a top dielectric layer over entire said wafer and planarizing said top dielectric layer; and
   forming metal connections to said topmost metal contact layer in said logic area and forming top lead connections to said MTJ elements in said memory area.

8. The method according to claim 7 wherein said memory area is surrounded by said logic area.

9. The method according to claim 7 wherein said a topmost metal contact layer contacts a plurality of CMOS devices in a substrate of said wafer in a logic area and wherein said topmost metal contact layer in said memory area serves as a metal landing pad.

10. The method according to claim 7 wherein said topmost metal contact layer comprises copper.

11. The method according to claim 7 wherein said metal layer comprises tantalum, tungsten, titanium, titanium nitride, tantalum nitride, or alloys of these materials.

12. The method according to claim 7 wherein said metal connections and top lead connections comprise copper.

13. A method of fabricating an embedded memory device comprising:
   providing a wafer having a memory area and a logic area;
   providing a topmost metal contact layer on a surface of said wafer and covering said topmost metal contact layer with a first etch stop layer;
   depositing an isolation dielectric layer on said first etch stop layer;
   thereafter, in said memory area, opening vias through said isolation dielectric layer and said first etch stop layer to said topmost metal contact layer and filling said vias with copper;
   depositing a second etch stop layer on said isolation dielectric layer and said copper vias;
   depositing a second dielectric layer on said second etch stop layer;
   thereafter, in said memory area, etching openings through said second dielectric layer and said second etch stop layer to said copper vias and, in said logic area, opening evenly distributed dummy fill patterns through said dielectric and etch stop layers;
   filling said openings and dummy fill patterns with a metal layer and planarizing said metal layer thereby forming a flat wafer surface;
   forming MTJ elements on said flat wafer surface in said memory area and forming dummy MTJ elements on said flat wafer surface in said logic area;
   thereafter depositing a third etch stop layer and an overlying hard mask layer over said MTJ elements;
   covering said the memory area with a mask and etching away said hard mask layer to the third etch stop layer in said logic area;
   thereafter removing said mask and etching away said dummy MTJ elements, said dummy fill patterns, and surrounding layers in said logic area not covered by said hard mask;

thereafter, depositing a top dielectric layer over entire said wafer and planarizing said top dielectric layer; and forming metal connections to said topmost metal contact layer in said logic area and forming top lead connections to said MTJ elements in said memory area.

14. The method according to claim 13 wherein said a topmost metal contact layer contacts a plurality of CMOS devices in a substrate of said wafer in a logic area and wherein said topmost metal contact layer in said memory area serves as a metal landing pad.

15. The method according to claim 13 wherein said topmost metal contact layer comprises copper.

16. The method according to claim 13 wherein said metal layer comprises tantalum, tungsten, titanium, titanium nitride, tantalum nitride, or alloys of these materials.

17. The method according to claim 13 wherein said metal connections and top lead connections comprise copper.

\* \* \* \* \*